(12) United States Patent
Kobayashi

(10) Patent No.: US 9,536,959 B2
(45) Date of Patent: Jan. 3, 2017

(54) POWER SEMICONDUCTOR DEVICE HAVING FIELD PLATE ELECTRODE

(71) Applicant: Kabushiki Kaisha Toshiba, Minato-ku, Tokyo (JP)

(72) Inventor: Kenya Kobayashi, Nonoichi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/837,822

(22) Filed: Aug. 27, 2015

(65) Prior Publication Data
US 2016/0260808 A1   Sep. 8, 2016

(30) Foreign Application Priority Data
Mar. 5, 2015   (JP) .................. 2015-043672

(51) Int. Cl.
*H01L 29/02* (2006.01)
*H01L 29/40* (2006.01)
*H01L 29/06* (2006.01)

(52) U.S. Cl.
CPC ......... *H01L 29/402* (2013.01); *H01L 29/0607* (2013.01); *H01L 29/0649* (2013.01)

(58) Field of Classification Search
CPC ........... H01L 29/42368; H01L 29/0878; H01L 29/407; H01L 29/7813; H01L 29/402; H01L 29/41741; H01L 29/4238; H01L 29/495; H01L 29/66734; H01L 29/7802; H01L 29/7831; H01L 21/30655; H01L 21/823487
USPC .. 257/330, 341, E29.136, E29.257; 438/259, 270
See application file for complete search history.

(56) References Cited

U.S. PATENT DOCUMENTS

| | | | |
|---|---|---|---|
| 5,637,898 A | 6/1997 | Baliga | |
| 5,998,833 A | 12/1999 | Baliga | |
| 7,345,342 B2 | 3/2008 | Challa et al. | |
| 7,642,597 B2 | 1/2010 | Saito | |
| 8,022,470 B2 | 9/2011 | Hirler | |
| 2010/0052044 A1* | 3/2010 | Hirler ................. | H01L 29/7813 257/328 |

(Continued)

OTHER PUBLICATIONS

Y. Baba et al., "A Study on a High Blocking Voltage UMOS-FET With a Double Gate Structure", Proceedings of 1992 International Symposium on Power Semiconductor Devices & ICs, Tokyo, pp. 300-302.

(Continued)

*Primary Examiner* — Julio J Maldonado
*Assistant Examiner* — Cory Eskridge
(74) *Attorney, Agent, or Firm* — White & Case LLP

(57) ABSTRACT

A semiconductor device includes first to third semiconductor regions, first to fourth electrodes and a first insulating film. The first insulating film is provided between the third electrode and the first semiconductor region, between the third electrode and the second semiconductor region, between the third electrode and the third semiconductor region, and between the fourth electrode and the first semiconductor region. The first insulating film has a first insulating region, a second insulating region and a third insulating region. A first width in the first insulating region is different from a second width in the second insulating region. The first insulating region and the second insulating region are arranged in the direction. A third width of the third insulating region is constant along the second direction.

19 Claims, 14 Drawing Sheets

(56) References Cited

U.S. PATENT DOCUMENTS

2013/0069151 A1* 3/2013 Ohta .................... H01L 29/407
257/331

OTHER PUBLICATIONS

Masahito Kodama et al., "Temperature characteristics of a new 100V rated power MOSFET, VLMOS (Vertical LOCOS MOS)", Proceedings of 2004 International Symposium on Power Semiconductor Devices & ICs, Kitakyushu, pp. 463-466.
G. E. J. Koops et al., "Resurf Stepped Oxide (RSO) MOSFET for 85V having a record-low specific on-resistance", Proceedings of 2004 International Symposium on Power Semiconductor Devices & ICs, Kitakyushu, pp. 185-188.
M. A. Gajda et al., "Industrialisation of Resurf Stepped Oxide Technology for Power Transistors", Proceedings of the 18th International Symposium on Power Semiconductor Devices & ICs, Jun. 4-8, 2006 Naples, Italy, pp. 109-112.
P. Goarin et al., "Split-gate Resurf Stepped Oxide (RSO) MOSFETs for 25V applications with record low gatge-to-drain charge", Proceedings of the 19th International Symposium on Power Semiconductor Devices & ICs, May 27-30, 2007 Jeju, Korea, pp. 61-64.
Kenya Kobayashi et al., "An 18V n-channel UMOSFET with Super Low On-resistance by using Vertical Resurf Structure", Joint Technical Meeting, IEE Japan, EDD-12-068, SPC-12-141, pp. 49-53.
Kenya Kobayashi et al., 100 V Class Multiple Stepped Oxide Field Plate Trench MOSFET (MSO-FP-MOSFET) Aimed to Ultimate Structure Realization, Proceedings of the 27th International Symposium on Power Semiconductor Devices & IC's, May 10-14, 2015, Kowloon Shangri-La, Hong Kong, pp. 141-144.

* cited by examiner

POWER SEMICONDUCTOR DEVICE HAVING FIELD PLATE ELECTRODE

CROSS-REFERENCE TO RELATED APPLICATIONS

This application is based upon and claims the benefit of priority from Japanese Patent Application No. 2015-043672, filed on Mar. 5, 2015; the entire contents of which are incorporated herein by reference.

FIELD

Embodiments described herein relate generally to a semiconductor device.

BACKGROUND

There is a semiconductor device such as a metal oxide semiconductor field effect transistor (MOSFET) that has a field plate structure having a field plate electrode provided below a gate electrode. By disposing the field plate electrode, electric field intensity in a drift region of the MOSFET is relaxed. Thus, a breakdown withstand voltage (hereinafter simply referred to as a withstand voltage) between the drain and the source of the MOSFET is improved. Further, due to the improvement of the withstand voltage, the carrier density of the drift region can be set to a high level, and thus, an ON resistance of the MOSFET can be decreased. In other words, according to the MOSFET having the field plate structure, a trade-off relationship between the improvement of the withstand voltage and the decrease of the ON resistance in the MOSFET can be improved.

However, in such a MOSFET, the electric field is concentrated in the p-n junction part between the base region and the drift region, or the vicinity of the lower end of the field plate electrode, and thus, the sufficient withstand voltage cannot be obtained in some cases. An improvement is required for the trade-off relationship between the improvement of the withstand voltage and the decrease of the ON resistance in the MOSFET having the field plate structure.

DETAILED DESCRIPTION

According to one embodiment, a semiconductor device includes: a first semiconductor region of a first conductivity type; a second semiconductor region of a second conductivity type and selectively provided on the first semiconductor region; a third semiconductor region of the first conductivity type and selectively provided on the second semiconductor region; a first electrode electrically connected to the first semiconductor region; a second electrode provided on the third semiconductor region, and the second electrode electrically being connected to the third semiconductor region; a third electrode extending in a second direction crossing a first direction from the first electrode toward the second electrode; a fourth electrode provided on the first electrode side of the third electrode, and the fourth electrode extending in the second direction; and a first insulating film.

The first insulating film is provided between the third electrode and the first semiconductor region, between the third electrode and the second semiconductor region, between the third electrode and the third semiconductor region, and between the fourth electrode and the first semiconductor region. The first insulating film has a first insulating region and a second insulating region provided between the fourth electrode and the first semiconductor region. A first width between the fourth electrode and the first semiconductor region in the first insulating region is different from a second width between the fourth electrode and the first semiconductor region in the second insulating region. The first insulating region and the second insulating region are arranged in the second direction.

Some embodiments of the invention will hereinafter be explained with reference to the accompanying drawings. In the explanation presented hereinafter, the same members are denoted with the same reference symbols, and the explanation of the members presented once will arbitrarily be omitted. Although in the embodiment, it is assumed that a first conductivity type corresponds to the n-type, and a second conductively type corresponds to the p-type, it is also possible to assume that the first conductivity type corresponds to the p-type, and the second conductively type corresponds to the n-type in the embodiment. In the embodiment, it is expressed that the carrier concentration of the n-type (the first conductivity type) decreases in the order of $n^+$-type, n-type.

First Embodiment

Figure 1A:
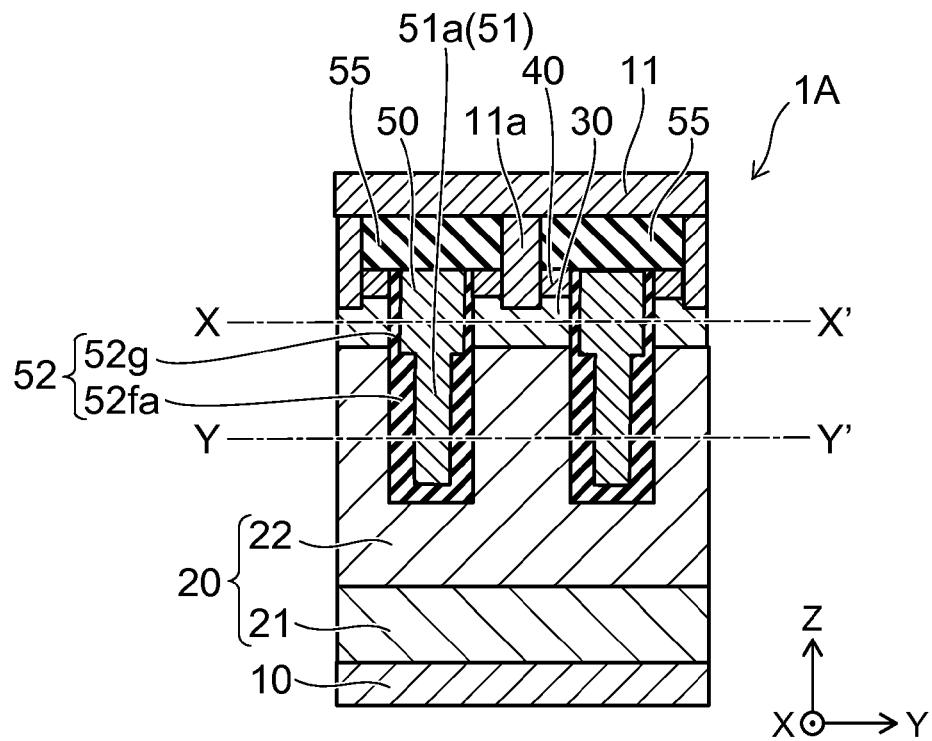
FIGS. 1A and 1B are schematic cross-sectional views showing a principal part of a semiconductor device according to a first embodiment.
Figure 1B:
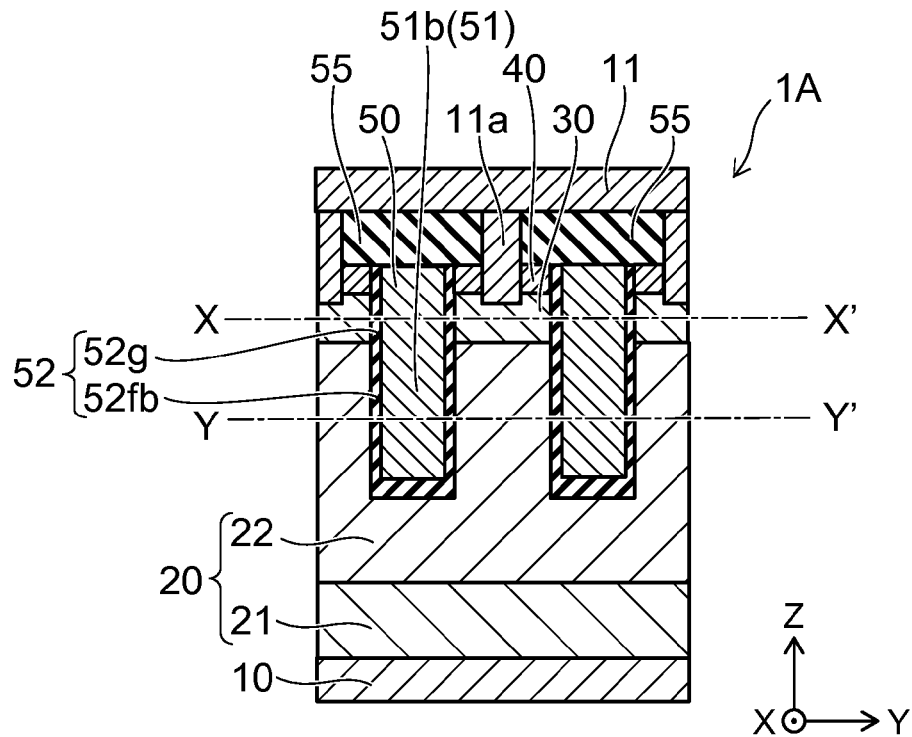

FIGS. 1A and 1B are schematic cross-sectional views showing a principal part of a semiconductor device according to a first embodiment. FIG. 1A shows a cross-sectional surface at a position along the B-B' line shown in FIGS. 2A and 2B. FIG. 1B shows a cross-sectional surface at a position along the A-A' line shown in FIGS. 2A and 2B.

Figure 2A:
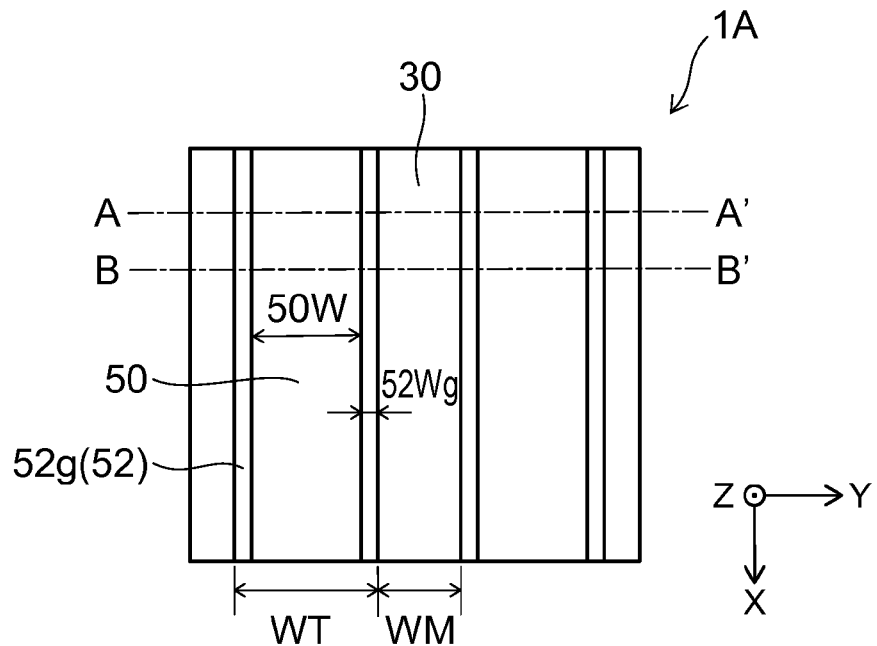
FIGS. 2A and 2B are schematic plan views showing a principal part of the semiconductor device according to the first embodiment.
Figure 2B:
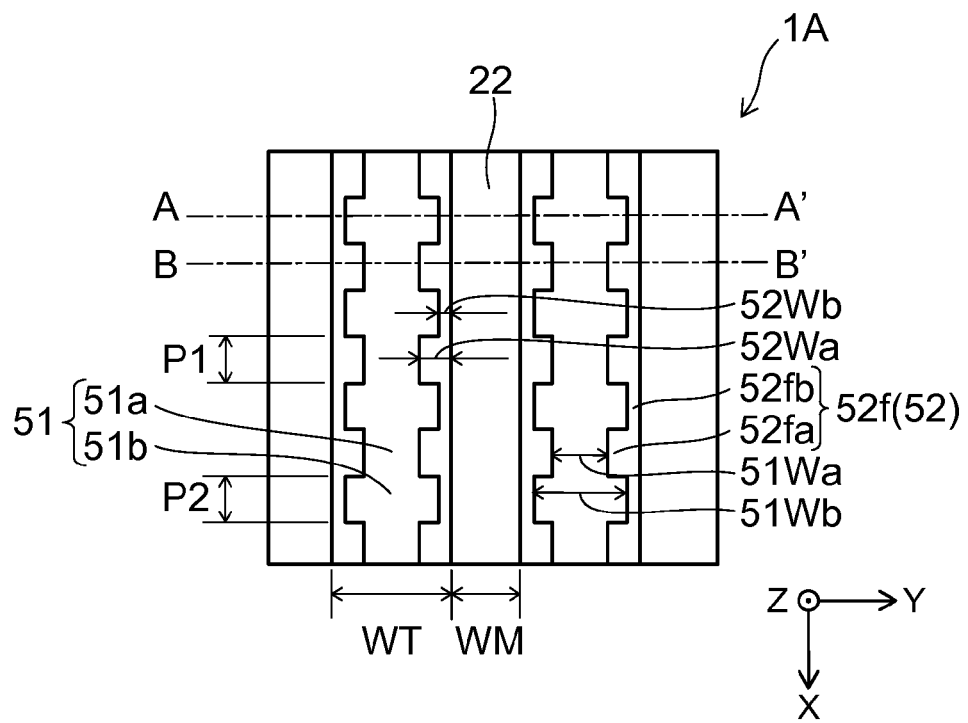

FIGS. 2A and 2B are schematic plan views showing a principal part of the semiconductor device according to the first embodiment. FIG. 2A shows a cross-sectional surface at a position along the X-X' line shown in FIGS. 1A and 1B. FIG. 2B shows a cross-sectional surface at a position along the Y-Y' line shown in FIGS. 1A and 1B.

The semiconductor device 1A according to the first embodiment has a first semiconductor region (hereinafter, e.g., semiconductor region 20), a second semiconductor region (hereinafter, e.g., a p-type base region 30), a third semiconductor region (hereinafter, e.g., an $n^+$-type source region 40), a first electrode (hereinafter, e.g., a drain electrode 10), a second electrode (hereinafter, e.g., a source electrode 11), third electrodes (hereinafter, e.g., gate electrodes 50), fourth electrodes (hereinafter, e.g., field plate electrodes 51), and first insulating films (hereinafter, e.g., insulating films 52).

In the embodiment, a direction from the drain electrode 10 toward the source electrode 11 is defined as a first direction (a Z-direction), a direction intersecting with the Z-direction is defined as a second direction (an X-direction), and a direction intersecting with the Z-direction and a X-direction is defined as the Y-direction.

The semiconductor region 20 has an $n^+$-type drain region 21, and an n-type drift region 22 provided on the $n^+$-type drain region 21. The $n^+$-type drain region 21 is electrically connected to the drain electrode 10.

The p-type base region 30 is selectively provided on the n-type drift region 22 out of the semiconductor region 20. The p-type base region 30 extends in the X-direction. The $n^+$-type source region 40 is selectively provided on the p-type base region 30. The $n^+$-type source region 40 extends in the X-direction.

The source electrode 11 is provided on the $n^+$-type source region 40. The source electrode 11 is electrically connected to the $n^+$-type source region 40 and the p-type base region 30 via a contact region 11a. In the embodiment, it is also possible to include the contact region 11a in the source electrode 11 to form the source electrode.

The gate electrode 50 faces the n-type drift region 22, the p-type base region 30, and the $n^+$-type source region 40 via a gate insulating film 52g. The gate electrode 50 extends in the X-direction (FIG. 2A). The width 50W of the gate electrode 50 in the Y-direction is nearly the same as the width thereof in the X-direction. Further, the width 52Wg of the gate insulating film 52g in the Y-direction is nearly the same as the width thereof in the X-direction. Here, "nearly the same" is defined as an expression having the meaning including the case of being substantially the same, besides the case of being completely the same.

The field plate electrodes 51 (hereinafter referred to as FP electrodes 51) face each other via the n-type drift region 22 and field plate electrode films 52f (hereinafter referred to as FP insulating films 52f). The FP electrodes 51 are each located on the drain electrode 10 side of the gate electrode 50. The FP electrodes 51 each extend in the X-direction. The FP electrode 51 is arranged side by side with the gate electrode 50 in the Z-direction. The FP electrode 51 is connected to the gate electrode 50.

The FP electrode 51 has first FP regions 51a and second FP regions 51b. As shown in FIG. 2B, the width of the first FP regions 51a in the Y-direction is different from the width of the second FP regions 51b in the Y-direction. For example, in the Y-direction, the width 51Wa of the first FP region 51a is narrower than the width 51Wb of the second FP region 51b. The first FP region 51a is connected to the second FP region 51b. The first FP regions 51a and the second FP regions 51b are arranged alternately in the X-direction.

The FP insulating films 52f are each provided between the FP electrode 51 and the n-type drift region 22. The FP insulating films 52f each have first insulating regions 52fa and second insulating regions 52fb. The first insulating regions 52fa are in contact with the first FP regions 51a, respectively. The second insulating regions 52fb are in contact with the second FP regions 51b, respectively. Between the FP electrode 51 and the n-type drift region 22, the width of the first insulating regions 52fa and the width of the second insulating regions 52fb are different from each other. For example, the width 52Wa in the Y-direction is different from the width 52Wb in the Y-direction. The width 52Wa is in a range of, for example, 0.05 µm through 0.7 µm. The width 52Wb is in a range of, for example, 0.03 µm through 0.1 µm.

The first insulating region 52fa is in contact with the second insulating region 52fb. The first insulating region 52fa and the second insulating region 52fb are arranged side by side in the X-direction. For example, the first insulating regions 52fa and the second insulating regions 52fb are alternately arranged in the X-direction. The film thickness (the width 52Wb) of the second insulating regions 52fb is nearly the same as, for example, the film thickness (the width 52Wg) of the gate insulating film 52g.

In the X-direction, the length P1 of each of the first insulating regions 52fa is nearly the same as the length P2 of each of the second insulating regions 52fb. For example, the length P1 is in a range of 0.1 µm through 0.5 µm. The length P2 is in a range of 0.1 µm through 0.5 µm.

In the embodiment, the gate insulating film 52g and the FP insulating film 52f may integrally be formed as an insulating film 52.

The carrier concentration of the n-type drift region 22 in contact with the first insulating region 52fa is nearly the same as the carrier concentration of the n-type drift region 22 in contact with the second insulating region 52fb. The carrier concentration is, for example, $5 \times 10^{15}$ (atoms/cm$^3$).

Further, in the case of assuming a structure having the gate electrode 50, the FP electrode 51, and the insulating film 52 as a trench region, the width WT of the trench region in the Y-direction is in a range of 0.3 µm through 1.5 µm. In the case of assuming the n-type drift region 22 sandwiched by the adjacent trench regions as a mesa region, the width of the mesa region in the Y-direction is in a range of 0.3 µm through 1.5 µm.

In the case of assuming a region obtained by combining the trench region and the mesa region with each other as a cell region, the width of the cell region in the Y-direction is in a range of 0.6 μm through 3.0 μm. Further, between the gate electrode 50 and the source electrode 11, an interlayer insulating film 55 is provided.

A component of each of the semiconductor region 20, the p-type base region 30, and the n⁺-type source region 40 is, for example, silicon (Si). The component of each of the semiconductor region 20, the p-type base region 30, and the n⁺-type source region 40 may also be at least one of a silicon carbide (SiC), gallium nitride (GaN), germanium (Ge), silicon-germanium (SiGe), or the like. The material of the insulating film includes, for example, at least one of a silicon oxide ($SiO_x$), a silicon nitride ($SiN_x$), or a germanium oxide (GeO).

The material of the drain electrode 10 or the source electrode 11 is metal including at least one selected from a group consisting of, for example, aluminum (Al), titanium (Ti), nickel (Ni), tungsten (W), copper (Cu), and gold (Au).

The material of the contact region 11a is metal including at least one selected from a group consisting of, for example, tungsten (W), aluminum (Al), nickel (Ni), gold (Au), titanium (Ti), copper (Cu), and polysilicon. The material of the gate electrode 50 and the FP electrode 51 includes, for example, polysilicon.

As an impurity element of the conductivity type such as the n⁺-type or the n-type, there is applied, for example, phosphorous (P) or arsenic (As). As an impurity element of the conductivity type such as the p-type, there is applied, for example, boron (B) or aluminum (Al). Further, in the semiconductor device 1A, substantially the same advantage can be obtained by exchanging the conductivity types of the p-type and the n-type for each other.

Figure 3A:
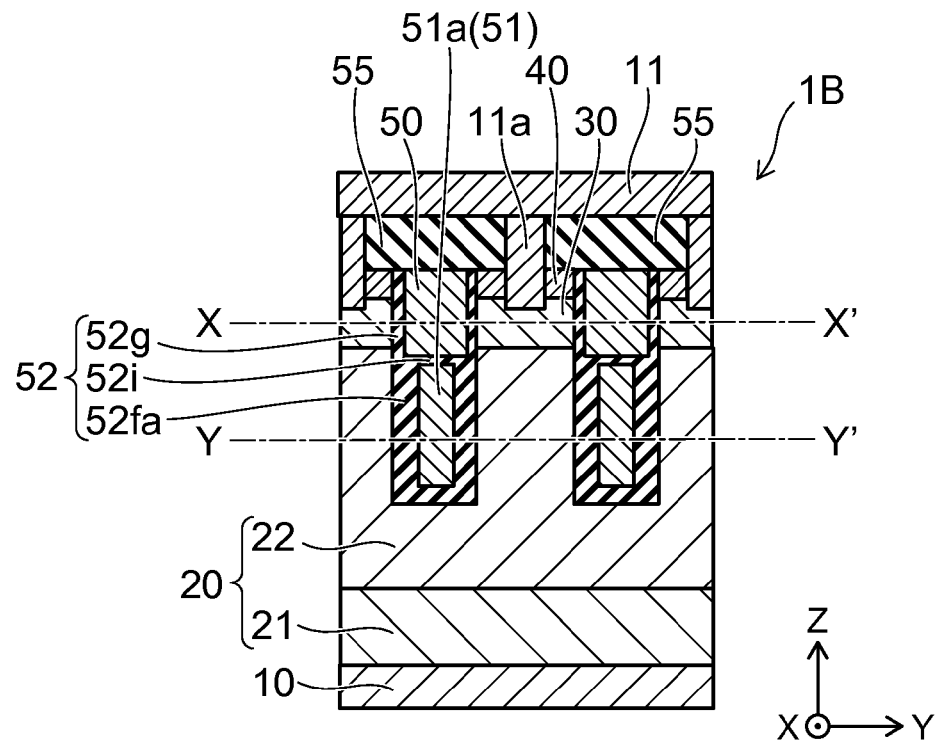
FIGS. 3A and 3B are schematic cross-sectional views showing a principal part of a semiconductor device according to another example of the first embodiment.
Figure 3B:
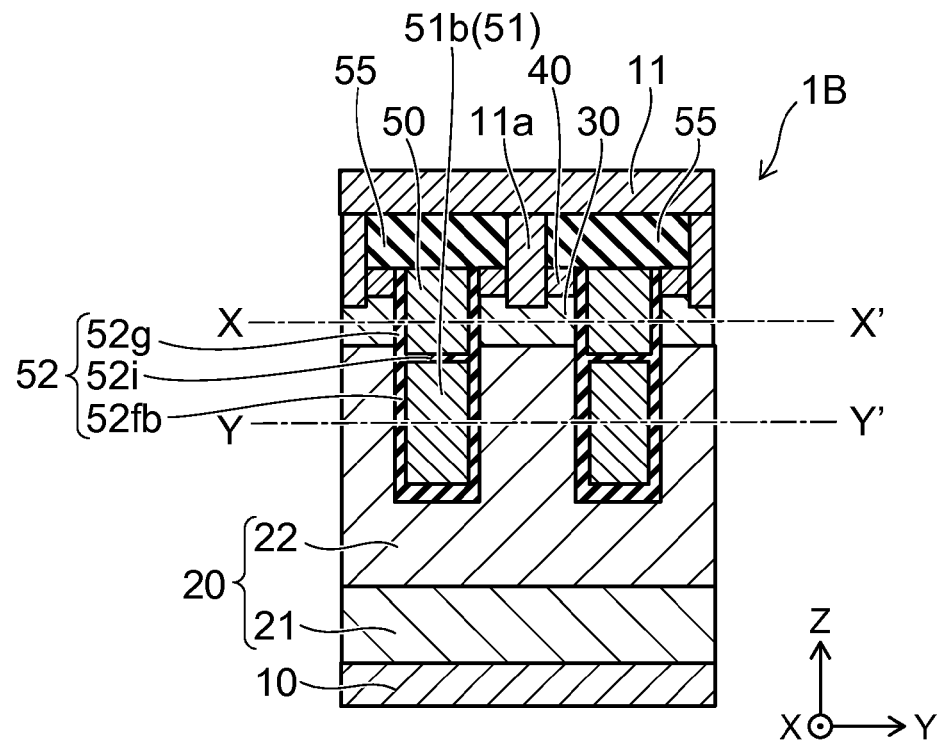

FIGS. 3A and 3B are schematic cross-sectional views showing a principal part of a semiconductor device according to another example of the first embodiment. FIG. 3A shows a cross-sectional surface at a position along the B-B' line shown in FIGS. 2A and 2B. FIG. 3B shows a cross-sectional surface at a position along the A-A' line shown in FIGS. 2A and 2B.

In the semiconductor device 1B shown in FIGS. 3A and 3B, an insulating film 52i is provided between the gate electrode 50 and the FP electrode 51. The insulating film 52i is included in the insulating film 52. In the semiconductor device 1B, the gate electrode 50 and the FP electrode 51 is separated from each other in the Z-direction. To the FP electrode 51, for example, the ground potential or the potential of the source electrode 11 is applied. The potential of the FP electrode 51 may also be, for example, a floating potential.

Before explaining functions of the semiconductor device according to the first embodiment, functions of semiconductor devices according to reference examples will be explained.

Figure 4A:
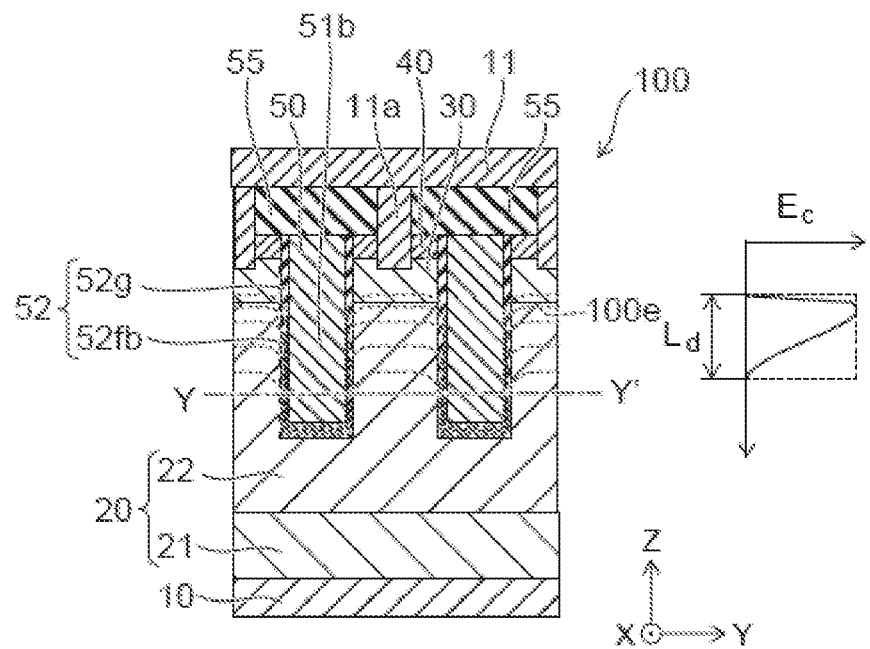
FIG. 4A is a schematic cross-sectional view showing a principal part of a semiconductor device according to a first reference example.
Figure 4B:
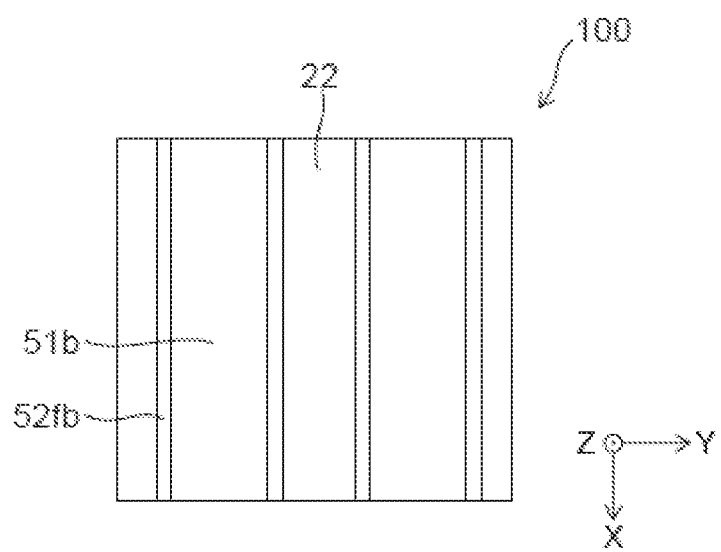
FIG. 4B is a schematic plan view showing a principal part of the semiconductor device according to the first reference example, and shows a cross-sectional surface at a position along the Y-Y' line shown in FIG. 4A.

FIG. 4A is a schematic cross-sectional view showing a principal part of the semiconductor device according to a first reference example. FIG. 4B is a schematic plan view showing a principal part of the semiconductor device according to the first reference example, and shows a cross-sectional surface at a position along the Y-Y' line shown in FIG. 4A.

In the semiconductor device 100 shown in FIGS. 4A and 4B, the FP electrode does not have the structure in which the first FP regions 51a and the second FP regions 51b are arranged alternately in the X-direction. The semiconductor device 100 has the second FP region 51b extending in the X-direction as the FP electrode. Further, the semiconductor device 100 has the second insulating region 52fb extending in the X-direction as the FP insulating film.

Here, the semiconductor device 100 is in an OFF state. Specifically, although a higher potential than that of the source electrode 11 is applied to the drain electrode 10, no current flows between the source and the drain since a lower potential than a threshold potential (Vth) is applied to the gate electrode 50. In the OFF state, a depletion layer spreads from the p-n junction part (the p-type base region 30/the n-type drift region 22) toward the p-type base region 30 and the n-type drift region 22. Here, it is assumed that a voltage immediately lower than a voltage with which the avalanche breakdown occurs in the n-type drift region 22 is applied between the source and the drain.

FIG. 4A shows the equipotential lines 100e in the n-type drift region 22 sandwiched by the adjacent FP insulating films 52fb. For example, the five equipotential lines 100e are shown as an example. The potential of each of the equipotential lines increases in a direction from the source side toward the drain side.

Further, in the right part of FIG. 4A, there is shown a graph of an electric field intensity distribution in a central portion of the mesa region. Here, the horizontal axis of the graph represents the electric field intensity ($E_C$), and the vertical axis represents the depth ($L_D$) of the semiconductor device. In the graph, there is shown the electric field intensity of the n-type drift region 22 from the p-n junction part to a position of a lower end of the FP electrode 51.

In the semiconductor device 100, the FP electrode is constituted by the second FP region 51b having a large width, and the FP insulating film is constituted by the second insulating region 52fb having a small thickness. In the case of such a structure, the depletion layer in a direction from the p-n junction part toward the n-type drift region 22 becomes difficult to extend. The equipotential lines 100e is concentrated to the p-n junction part on the upper side of the FP electrode, and the degree of the concentration is relaxed in a direction toward the lower part of the mesa region. Therefore, the electric field intensity ($E_C$) is high in the p-n junction part, and decreases in a direction toward the drain.

Here, the withstand voltage $V_B$ in the n-type drift region 22 in the MOSFET is an integral value of the electric field intensity in an area (length) in which the depletion layer is formed, and the ideal maximum value (an ideal withstand voltage) thereof can be expressed as follows.

$$V_B = E_C \times L_D \qquad \text{Formula (1)}$$

The electric field intensity distribution fulfilling Formula (1) is represented by the dotted line in the graph.

Here, $E_C$ represents the critical electric field leading to the avalanche breakdown, and $L_D$ represents the depth (the length) of the n-type drift region 22 from a position of the equipotential line nearest to the source to a position of the equipotential line nearest to the drain. Formula (1) shows the fact that the higher either one of $E_C$ and $L_D$ becomes, the higher the withstand voltage $V_B$ becomes.

In the semiconductor device 100, the equipotential lines 100e are concentrated from the lower end of the FP electrode to the p-n junction part on the upper side. Therefore, since the electric field intensity ($E_C$) becomes high in the p-n junction part, the electric field intensity distribution shows a distribution in which the electric field intensity decreases in a direction from the source toward the drain. Therefore, the withstand voltage $V_B$ is approximated by, for example, the following formula.

$$V_B = (1/2) \times E_C \times L_D \qquad \text{Formula (2)}$$

Therefore, in the semiconductor device 100, the withstand voltage $V_B$ decreases.

As described above, in the semiconductor device 100, since the depletion layer becomes difficult to extend from the p-n junction part toward the n-type drift region 22, the withstand voltage does not rise to a high level. In order to make the depletion layer extend in the structure of the semiconductor device 100, there exists a method of decreasing the carrier concentration of the n-type drift region 22. However, according to this method, the resistivity of the n-type drift region 22 in the OFF state problematically rises.

Figure 5:
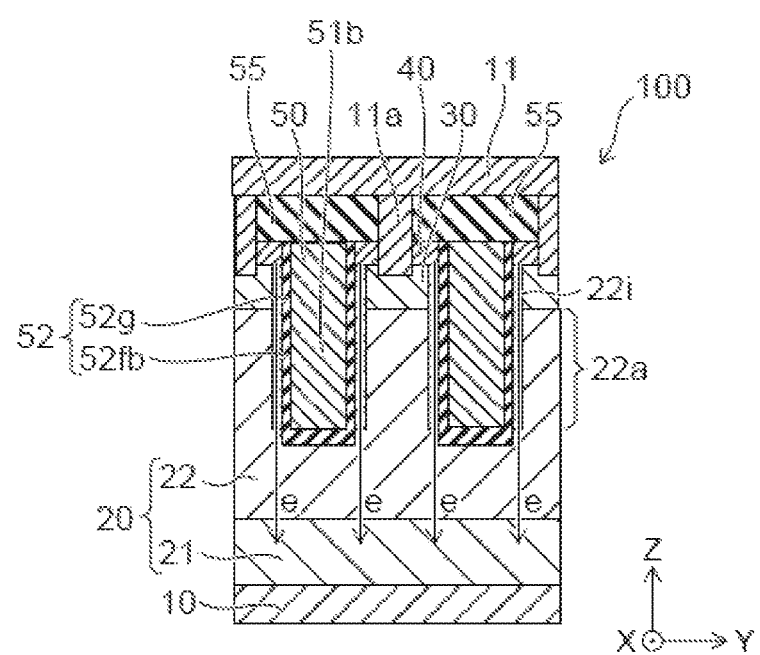
FIG. 5 is a schematic cross-sectional view showing the principal part of the semiconductor device according to the first reference example.

FIG. 5 is a schematic cross-sectional view showing the principal part of the semiconductor device according to the first reference example.

FIG. 5 shows an ON state of the semiconductor device 100. In the ON state, a higher potential than that of the source electrode 11 is applied to the drain electrode 10, and a potential (e.g., a positive potential) equal to or higher than the threshold potential (Vth) is applied to the gate electrode 50.

Thus, a channel region is formed in the p-type base region 30 along the gate insulating film 52g, and at the same time, an inductive region 22i is also formed in the n-type drift region 22 along the FP insulating film 52. This is because, the FP electrode is connected to the gate electrode 50, and the second insulating region 52fb constituting the FP insulating film 52 is thin, and therefore, it is easy for the potential of the FP electrode to be conducted to the n-type drift region 22. In the inductive region 22i, electrons are accumulated.

Further, the electrons injected from the n⁺-type source region 40 to the p-type base region 30 gravitate to the FP electrode 51 at the positive potential, and flow in the vicinity of the FP insulating film. In other words, the electronic current (e) passes through the inductive region 22i, and flows into the drain. The inductive region 22i is a region low in resistance for the electronic current (e). Therefore, in the semiconductor device 100, reduction of the ON resistance in the n-type drift region 22a opposed to the FP electrode is realized.

For example, the resistivity of the n-type drift region 22 in the case in which the inductive region 22i is not formed becomes 10 through 20 times as high as the resistivity of the inductive region 22i.

It should be noted that if the carrier concentration of the n-type drift region 22 is set to a low level in order to make it easy for the depletion layer to extend in the n-type drift region 22 in the OFF state, the ON resistance in the other part of the n-type drift region 22 than the n-type drift region 22a problematically rises.

Figure 6A:
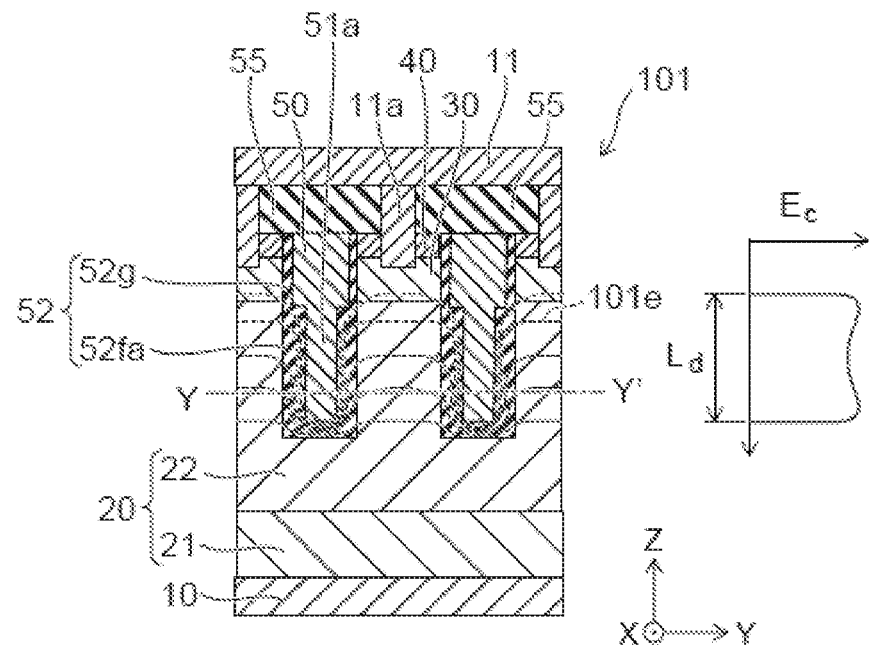
FIG. 6A is a schematic cross-sectional view showing a principal part of the semiconductor device according to a second reference example.
Figure 6B:
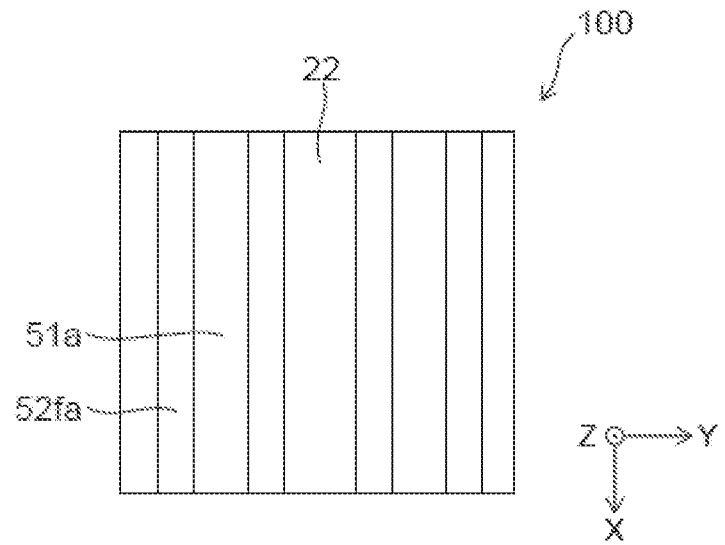
FIG. 6B is a schematic plan view showing a principal part of the semiconductor device according to the second reference example, and shows a cross-sectional surface at a position along the Y-Y' line shown in FIG. 6A.

FIG. 6A is a schematic cross-sectional view showing a principal part of the semiconductor device according to a second reference example. FIG. 6B is a schematic plan view showing a principal part of the semiconductor device according to the second reference example, and shows a cross-sectional surface at a position along the Y-Y' line shown in FIG. 6A.

The semiconductor device 101, shown in FIGS. 6A and 6B, does not also have the structure in which the first FP regions 51a and the second FP regions 51b are arranged alternately. The semiconductor device 101 has the first FP region 51a extending in the X-direction as the FP electrode. Further, the semiconductor device 101 has the first insulating region 52fa extending in the X-direction as the FP insulating film. Here, the semiconductor device 101 is in the OFF state, and a higher potential than that of the source electrode 11 is applied to the drain electrode 10. A voltage immediately lower than the voltage with which the avalanche breakdown occurs in the n-type drift region 22, for example, is applied between the source and the drain.

FIG. 6A shows the equipotential lines 101e in the n-type drift region 22 sandwiched by the adjacent FP insulating films. For example, the five equipotential lines 101e are shown as an example. The potential of each of the equipotential lines increases in a direction from the source side toward the drain side.

Further, in the right part of FIG. 6A, there is shown a graph of an electric field intensity distribution in a central portion of the mesa region. In the graph, there is shown the electric field intensity of the n-type drift region 22 from the p-n junction portion to a position of a lower end of the FP electrode 51.

In the semiconductor device 101, the FP electrode is constituted by the first FP region 51a having a small width, and the FP insulating film is constituted by the first insulating region 52fa having a large thickness. In the structure in which the FP electrode is thinned, the number of the equipotential lines in the lower part of the first insulating region 52fa having the large thickness becomes larger than that in the upper part. In other words, in the first insulating region 52fa having the large thickness, the higher the position is, the smaller the voltage sharing in the first insulating region 52fa becomes, and the lower the position is, the larger the voltage sharing becomes. Therefore, in the semiconductor device 1, the voltage sharing in the upper part of the first insulating region 52fa becomes smaller compared to the semiconductor device 100. Thus, the intervals of the equipotential lines 101e in the mesa region become nearly equal to each other, and it becomes easy for the depletion layer to extend from the p-n junction part in the direction toward the n-type drift region 22. The electric field intensity distribution in this case shows a distribution in which the electric field intensity becomes nearly even from the source side toward the drain. Thus, the withstand voltage $V_B$ is approximated by Formula (1). Therefore, in the semiconductor device 101, the withstand voltage $V_B$ rises compared to the semiconductor device 100.

Figure 7:
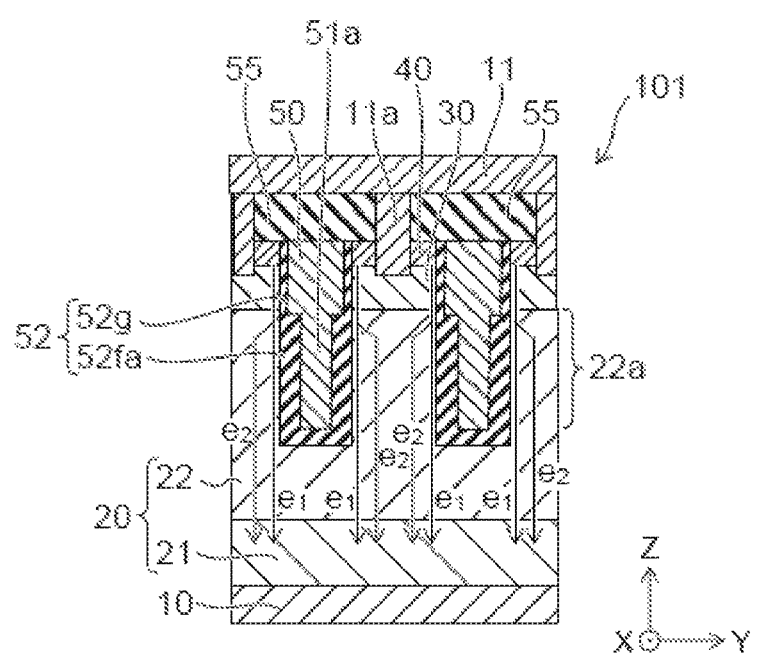
FIG. 7 is a schematic cross-sectional view showing a principal part of a semiconductor device according to a second reference example.

FIG. 7 is a schematic cross-sectional view showing the principal part of the semiconductor device according to the second reference example.

FIG. 7 shows the ON state of the semiconductor device 101. In the ON state, the channel region is formed in the p-type base region 30 along the gate insulating film 52g. It should be noted that in the semiconductor device 101, the first insulating region 52fb constituting the FP insulating film is thick. Therefore, it is difficult for the potential of the FP electrode to be conducted to the n-type drift region 22 compared to the semiconductor device 100.

Therefore, in the semiconductor device 101, it becomes difficult for the inductive region 22i to be formed compared to the semiconductor device 100. Further, since it becomes difficult for the potential of the FP electrode to be conducted to the n-type drift region 22, it becomes difficult for the electronic current to gravitate to the FP electrode 51 compared to the semiconductor device 100. Therefore, in the semiconductor device 101, the electrons flow in a path distant from the FP insulating film compared to the semiconductor device 100. For example, in FIG. 7, besides the electronic current ($e_1$), there is shown an electronic current ($e_2$) flowing distantly from the FP insulating film as the electronic current. For example, in the example shown in FIG. 7, the resistance of the n-type drift region 22 is obtained as a parallel resistance of a part of the resistance of the n-type drift region 22 where the electronic current ($e_1$) flows and the resistance of a part of the n-type drift region 22 where the electronic current ($e_2$) flows.

As described above, in the semiconductor device 101, since it becomes difficult to form the inductive region 22*i*, and the electronic current flows in the path distant from the FP insulating film, the ON resistance in the n-type drift region 22*a* opposed to the FP electrode rises compared to the semiconductor device 100.

In contrast, the advantages of the first embodiment will be explained using the semiconductor device 1A as an example.

Figure 8:
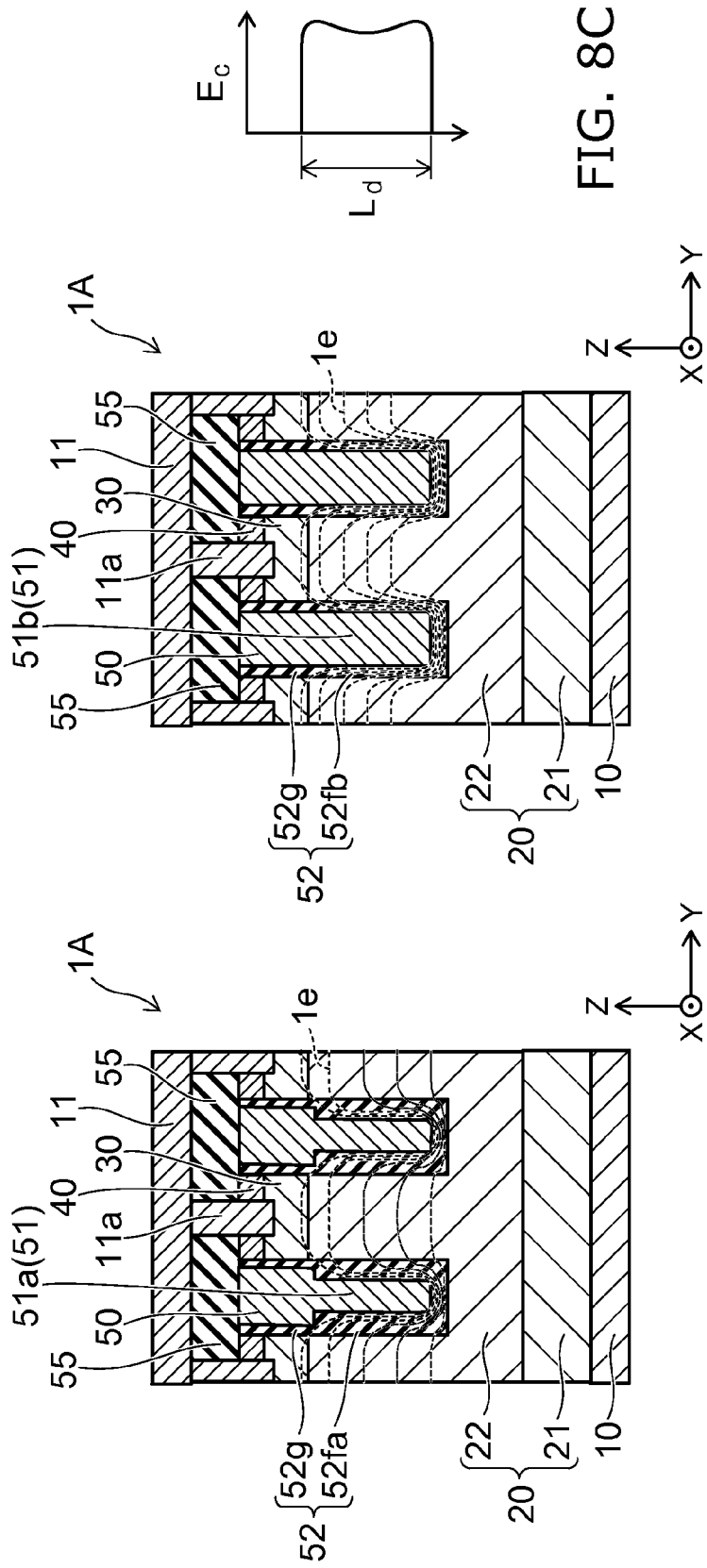
FIGS. 8A and 8B are schematic cross-sectional views showing a function of the semiconductor device 1A according to the first embodiment.
FIG. 8C is a graph showing the electric field intensity distribution of the semiconductor device 1A according to the first embodiment.

FIGS. 8A and 8B are schematic cross-sectional views showing a function of the semiconductor device 1A according to the first embodiment. FIG. 8C is a graph showing the electric field intensity distribution of the semiconductor device 1A according to the first embodiment. Here, FIG. 8A corresponds to a cross-sectional surface along the B-B' line shown in FIGS. 2A and 2B, and FIG. 8B corresponds to a cross-sectional surface along the A-A' line shown in FIGS. 2A and 2B.

FIG. 8C shows the electric field intensity distribution obtained by combining the electric field intensity distribution in the central portion of the mesa region of the semiconductor device 1A shown in FIG. 8A and the electric field intensity distribution in the central portion of the mesa region of the semiconductor device 1A shown in FIG. 8B.

As shown in FIGS. 8A and 8B, in the semiconductor device 1A, the FP electrode 51 has the first FP region 51*a* narrow in width besides the second FP region 51*b* large in width. Further, the FP insulating film 52*f* has the first insulating region 52*fa* large in width besides the second insulating region 52*fb* narrow in width. The first insulating regions 52*fa* and the second insulating regions 52*fb* are alternately arranged side by side in the X-direction.

Here, in the first insulating region 52*fa* having the large thickness, the number of the equipotential lines in the lower part becomes larger than that in the upper part. In other words, in the first insulating region 52*fa* having the large thickness, the higher the position is, the smaller the voltage sharing in the first insulating region 52*fa* becomes, and the lower the position is, the larger the voltage sharing becomes. Thus, the intervals of the equipotential lines 1*e* in the mesa region sandwiched by the first insulating regions 52*fa* become nearly equal to each other. As a result, it becomes easy for the depletion layer to extend from the p-n junction part in the direction toward the n-type drift region 22. The electric field intensity distribution in this case shows a distribution in which the electric field intensity becomes nearly even from the source side toward the drain.

Furthermore, the equipotential lines 1*e* in the mesa region sandwiched by the thin second insulating regions 52*fb* are drawn by the equipotential lines 1*e* in the mesa regions located on both sides in the X-direction, and thus, it becomes easy for the depletion layer to extend from the p-n junction part in the direction toward the n-type drift region 22. Therefore, the electric field intensity distribution becomes more constant from the source side toward the drain compared to the semiconductor device 100. Thus, the withstand voltage $V_B$ of the semiconductor device 1A is approximated by Formula (1). Therefore, in the semiconductor device 1A, the withstand voltage $V_B$ rises compared to the semiconductor device 100.

As described above, in the semiconductor device 1A, the electric field (the electric field in the Y-direction) from the first FP region 51*a* in the mesa region sandwiched by the first insulating regions 52*fa* also acts on the mesa region sandwiched by the second insulating regions 52*fb* adjacent thereto in the X-direction. In other words, in the semiconductor device 1A, there occurs three-dimensional electric field relaxation in which the electric field in the Z-direction is relaxed in the mesa region sandwiched by the second insulating regions 52*fb* in addition to the mesa region sandwiched by the first insulating regions 52*fa*.

Further, since the withstand voltage $V_B$ rises, in the n-type drift region 22, both of the carrier concentration in the n-type drift region 22*a* and the carrier concentration in the n-type drift region 22 other than the n-type drift region 22*a* can be set to high levels. In other words, according to the semiconductor device 1A, the ON resistance of the entire n-type drift region 22 can be decreased compared to the semiconductor device 100.

Figure 9:
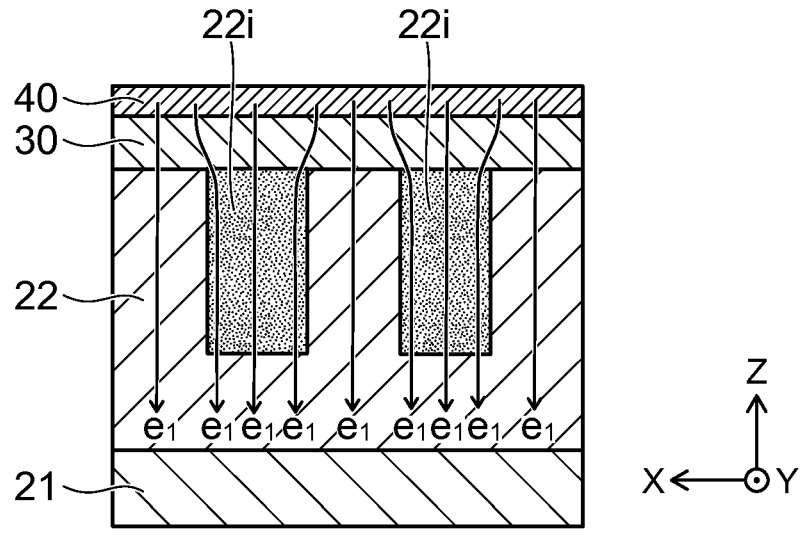
FIG. 9 is a schematic cross-sectional view showing another function of the semiconductor device 1A according to the first embodiment.

FIG. 9 is a schematic cross-sectional view showing another function of the semiconductor device 1A according to the first embodiment.

For example, FIG. 9 shows a state of the electronic current ($e_1$) flowing through the semiconductor device 1A viewed from the Y-direction.

The electrons, which were injected from the n$^+$-type source region 40 on the n-type drift region 22 in which the inductive region 22*i* is formed, pass through the p-type base region 30, and then flow through the low-resistance inductive region 22*i* without changing the proceeding direction.

Furthermore, the electrons, which were injected from the n$^+$-type source region 40 on the n-type drift region 22 in which the inductive region 22*i* is not formed, also pass through the p-type base region 30, and then change the proceeding direction to flow through the low-resistance inductive region 22*i*. This is because the electric current has the nature of flowing through a low-resistance region. Therefore, in the semiconductor device 1A, reduction of the ON resistance is realized.

Second Embodiment

Figure 10:
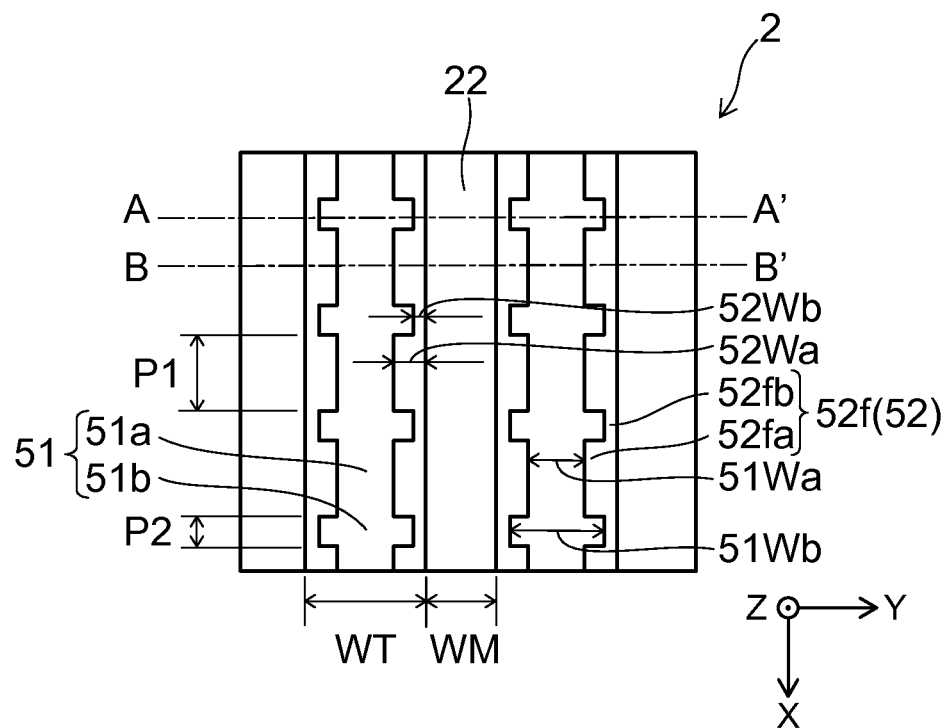
FIG. 10 is a schematic plan view showing a principal part of a semiconductor device according to a second embodiment.

FIG. 10 is a schematic plan view showing a principal part of a semiconductor device according to a second embodiment.

FIG. 10 corresponds to a cross-sectional surface at a position along the Y-Y' line shown in FIGS. 1A and 1B.

The semiconductor device 2 according to the second embodiment has the same constituents as those of the semiconductor device 1. It should be noted that in the semiconductor device 2, the length P1 of each of the first insulating regions 52*fa* is different from the length P2 of each of the second insulating regions 52*fb* in the X-direction. For example, the length P1 of each of the first insulating regions 52*fa* is longer than the length P2 of each of the second insulating regions 52*fb*. For example, the length P1 of each of the first insulating regions 52*fa* is arranged to be twice as long as the length P2 of each of the second insulating regions 52*fb*. Further, the length P1 of each of the first insulating regions 52*fa* is arranged to be more than double of the length P2 of each of the second insulating regions 52*fb*.

Further, in the semiconductor device 2, the length of each of the first FP regions 51*a* is different from the length of each of the second FP regions 51*b* in the X-direction. For example, the length of each of the first FP regions 51*a* is longer than the length of each of the second FP regions 51*b*. For example, the length of each of the first FP regions 51*a* is arranged to be twice as long as the length of each of the second FP regions 51*b*. Further, the length of each of the first FP regions 51*a* is arranged to be more than double of the length of each of the second FP regions 51*b*.

As described above, in the semiconductor device 2, the length P1 of each of the first insulating regions 52*fa* is arranged to be longer than the length P2 of each of the second insulating regions 52*fb*. Thus, it becomes easier to increase the distance between the equipotential lines in the n-type drift region 22 sandwiched by the adjacent second insulating regions 52*fb* small in thickness, due to the effect of the extension of the depletion layer toward the n-type drift region 22 in the mesa region sandwiched by the adjacent first insulating region 52*fa*. Thus, the electric field distribution in the mesa region sandwiched by the FP insulating films 52*f* becomes more constant as a whole. Therefore, the withstand voltage ($V_B$) of the semiconductor device 2 is improved compared to the withstand voltage ($V_B$) of the semiconductor device 1.

As described above, in the semiconductor device 2, the electric field (the electric field in the Y-direction) from the first FP region 51*a* in the mesa region sandwiched by the first insulating regions 52*fa* also acts on the mesa region sandwiched by the second insulating regions 52*fb* adjacent thereto in the X-direction. In other words, in the semiconductor device 2, there occurs three-dimensional electric field relaxation in which the electric field in the Z-direction is relaxed in the mesa region sandwiched by the second insulating regions 52*fb* in addition to the mesa region sandwiched by the first insulating regions 52*fa*.

Third Embodiment

Figure 11A:
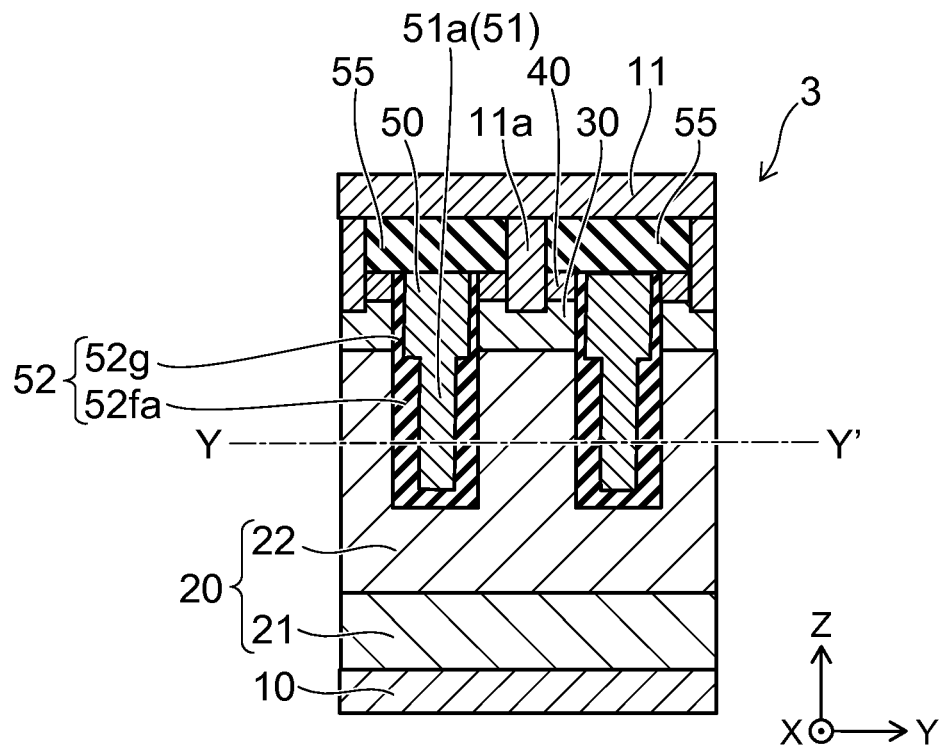
FIGS. 11A and 11B are schematic cross-sectional views showing a principal part of a semiconductor device according to a third embodiment.
Figure 11B:
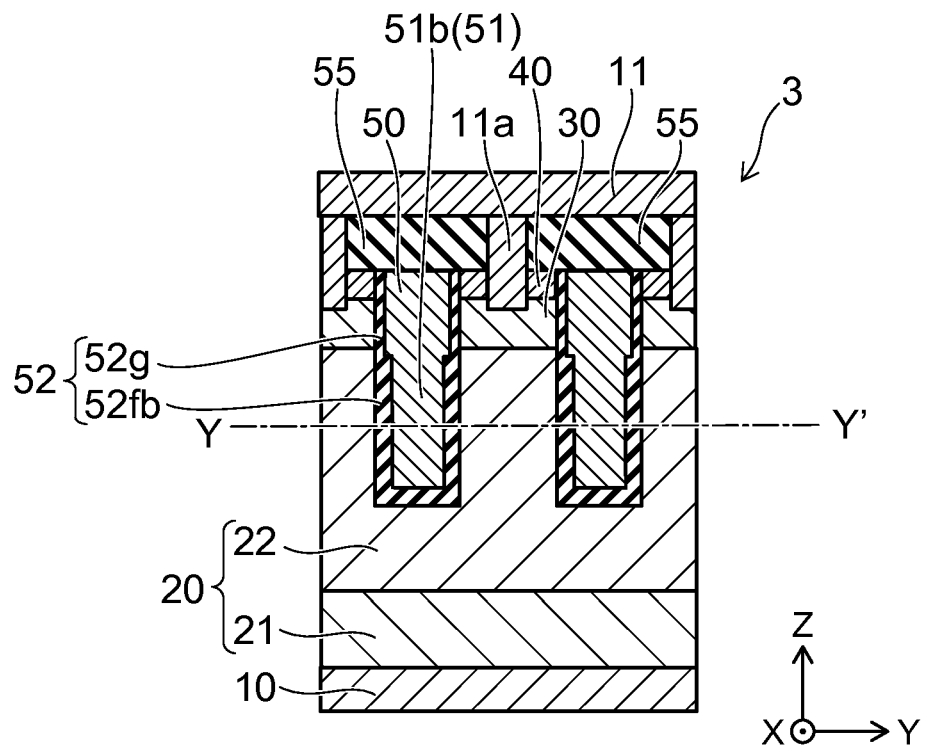

FIGS. 11A and 11B are schematic cross-sectional views showing a principal part of a semiconductor device according to a third embodiment. FIG. 11A shows a cross-sectional surface at a position along the B-B' line shown in FIG. 12. FIG. 11B shows a cross-sectional surface at a position along the A-A' line shown in FIG. 12.

Figure 12:
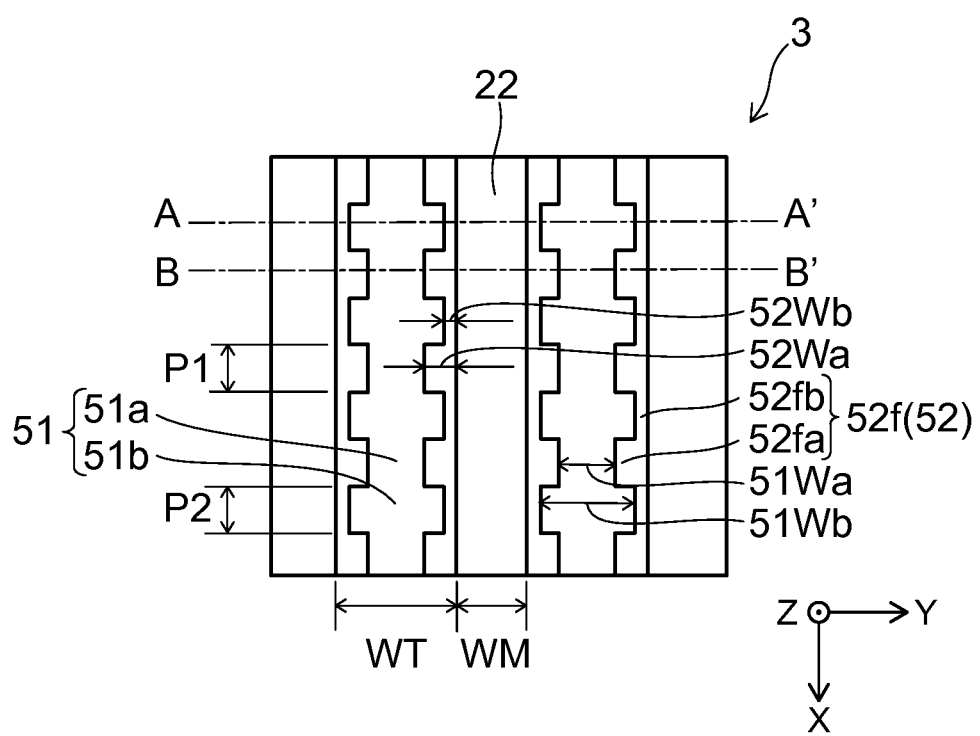
FIG. 12 is a schematic plan view showing the principal part of the semiconductor device according to the third embodiment, and shows a cross-sectional surface at a position along the Y-Y' line shown in FIGS. 11A and 11B.

FIG. 12 is a schematic plan view showing the principal part of the semiconductor device according to the third embodiment, and shows a cross-sectional surface at a position along the Y-Y' line shown in FIGS. 11A and 11B.

In the semiconductor device 3 according to the third embodiment, the film thickness of the second insulating regions 52*fb* is different from the film thickness of the gate insulating film 52*g* between the p-type base region 30 and the gate electrode 50. For example, the film thickness of the second insulating regions 52*fb* is thicker than the film thickness of the gate insulating film 52*g* and is thinner than the film thickness of the first insulating regions 52*fa*. The first insulating regions 52*fa* and the second insulating regions 52*fb* are alternately arranged side by side in the X-direction.

In the semiconductor device 3, the length P1 of each of the first insulating regions 52*fa* may be nearly the same as, or different from, the length P2 of each of the second insulating regions 52*fb*. For example, the length P1 of each of the first insulating regions 52*fa* may be longer than the length P2 of each of the second insulating regions 52*fb*. For example, the length P1 of each of the first insulating regions 52*fa* can be twice as long as the length P2 of each of the second insulating regions 52*fb*. Further, the length P1 of each of the first insulating regions 52*fa* may be more than double of the length P2 of each of the second insulating regions 52*fb*.

Further, in the semiconductor device 3, the length of each of the first FP regions 51*a* may be different from the length of each of the second FP regions 51*b* in the X-direction. For example, the length of each of the first FP regions 51*a* may be longer than the length of each of the second FP regions 51*b*. For example, the length of each of the first FP regions 51*a* may be twice as long as the length of each of the second FP regions 51*b*. Further, the length of each of the first FP regions 51*a* may be more than double of the length of each of the second FP regions 51*b*.

In the semiconductor device 3, the thickness of the second insulating regions 52*fb* is greater than the thickness of the gate insulating film 52*g*. Thus, in the mesa region sandwiched by the adjacent second insulating regions 52*fb*, it becomes easier for the depletion layer to extend from the p-n junction part in a direction toward the n-type drift region 22. Therefore, the withstand voltage ($V_B$) of the semiconductor device 3 is improved compared to the withstand voltages ($V_B$) of the semiconductor devices 1 and 2.

Fourth Embodiment

Figure 13A:
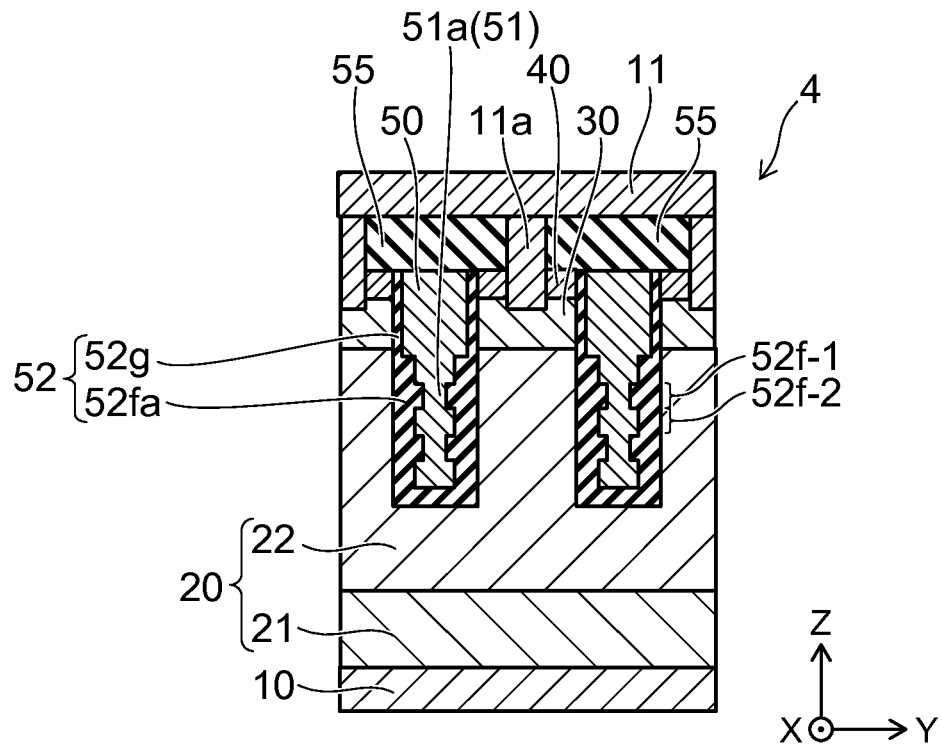
FIGS. 13A and 13B are schematic cross-sectional views showing a principal part of a semiconductor device according to a fourth embodiment.
Figure 13B:
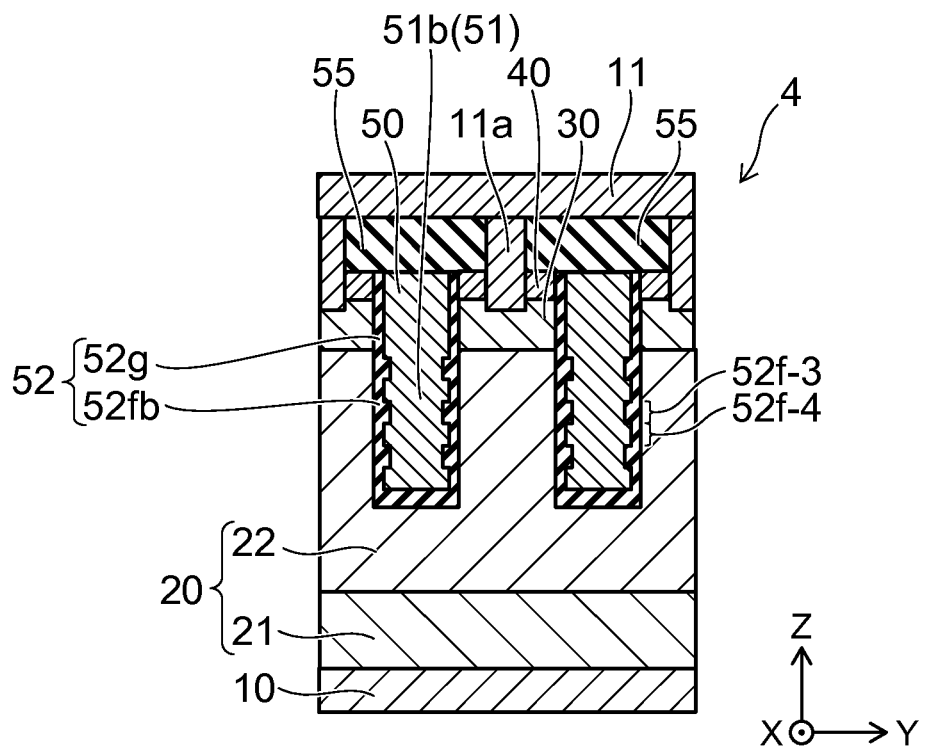

FIGS. 13A and 13B are schematic cross-sectional views showing a principal part of a semiconductor device according to a fourth embodiment.

In the semiconductor device 4 according to the fourth embodiment, the first insulating region 52*fa* of the FP insulating film 52*f* has first portions 52*f*-1 and second portions 52*f*-2. The first portions 52*f*-1 and the second portions 52*f*-2 are arranged alternately in the Z-direction. Between the first FP region 51*a* of the FP electrode 51 and the n-type drift region 22 of the semiconductor region 20, the width of each of the first portions 52*f*-1 is different from the width of each of the second portions 52*f*-2.

Further, the second insulating region 52*fb* of the FP insulating film 52*f* has third portions 52*f*-3 and fourth portions 52*f*-4. The third portions 52*f*-3 and the fourth portions 52*f*-4 are arranged alternately in the Z-direction. Between the second FP region 51*b* of the FP electrode 51 and the n-type drift region 22 of the semiconductor region 20, the width of each of the third portions 52*f*-3 is different from the width of each of the fourth portions 52*f*-4.

The first insulating regions 52*fa* and the second insulating regions 52*fb* are alternately arranged in the X-direction. The length P1 of each of the first insulating regions 52*fa* and the length P2 of each of the second insulating regions 52*fb* in the X-direction may be the same as, or different from, each other. For example, in the X-direction, the length P1 of each of the first insulating regions 52*fa* may be longer than the length P2 of each of the second insulating regions 52*fb*.

As described above, the semiconductor device 4 has the corrugated portion arranged side by side in the Z-direction in the FP insulating film 52*f*. Therefore, in the mesa region sandwiched by the first insulating regions 52*fa*, the intervals of the equipotential lines in the mesa region sandwiched by the first portions 52*f*-1 are further uniformed. Further, even in the mesa region sandwiched by the second insulating regions 52*fb*, the intervals of the equipotential lines in the mesa region sandwiched by the third portions 52*f*-3 are further uniformed. Thus, the withstand voltage ($V_B$) of the semiconductor device 4 is improved compared to the withstand voltage ($V_B$) of the semiconductor device 1.

Fifth Embodiment

FIGS. 14A through 15C are schematic plan views showing a manufacturing process of an FP insulating film according to a fifth embodiment.

Figure 14A:
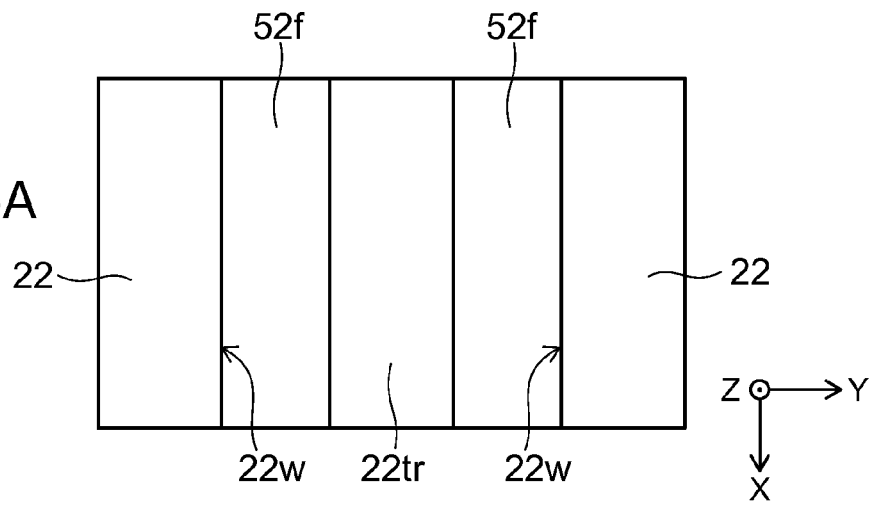
FIGS. 14A through 15C are schematic plan views showing a manufacturing process of an FP insulating film according to a fifth embodiment.

For example, as shown in FIG. 14A, after forming a trench 22*tr* in the n-type drift region 22, the FP insulating films 52*f* are formed on the respective side walls 22*w* of the n-type drift region 22 in the trench 22*tr*. The trench 22*tr* formed by digging down the n-type drift region 22 in the Z-direction extends in, for example, the X-direction. The FP insulating films 52f are formed using, for example, a thermal CVD method or a plasma CVD method.

Figure 14B:
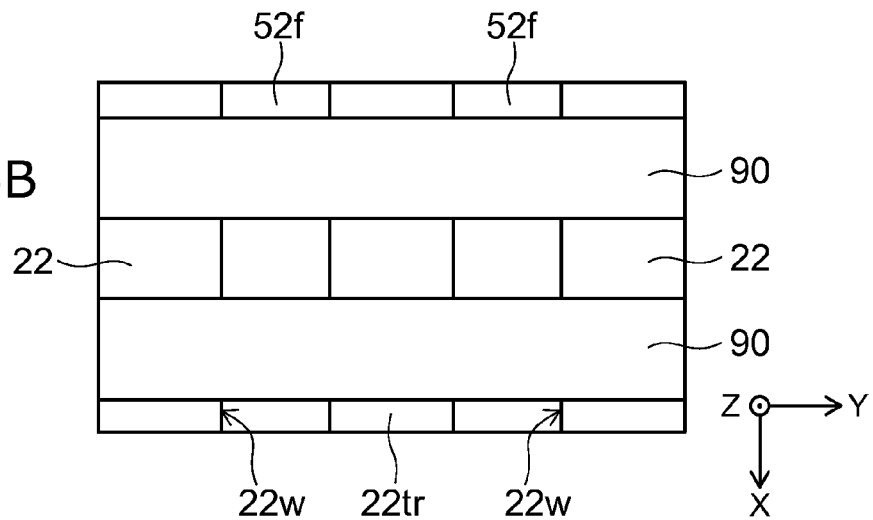

Then, as shown in FIG. 14B, mask layers 90 extending in the Y-direction are formed on the n-type drift region 22 and on the FP insulating film 52f.

Figure 14C:
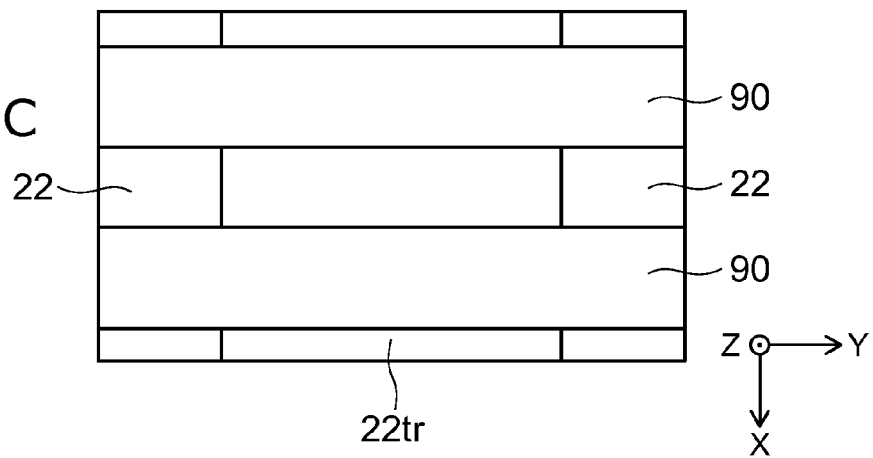

Then, as shown in FIG. 14C, the FP insulating films 52f exposed from the mask layers 90 are removed using, for example, reactive ion etching (RIE).

Figure 15A:
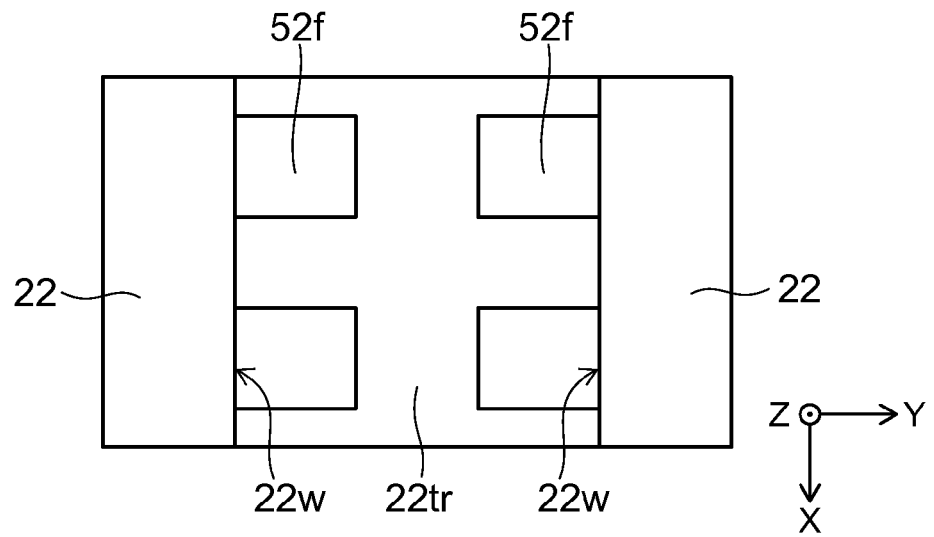

Subsequently, as shown in FIG. 15A, the mask layers 90 are removed.

Figure 15B:
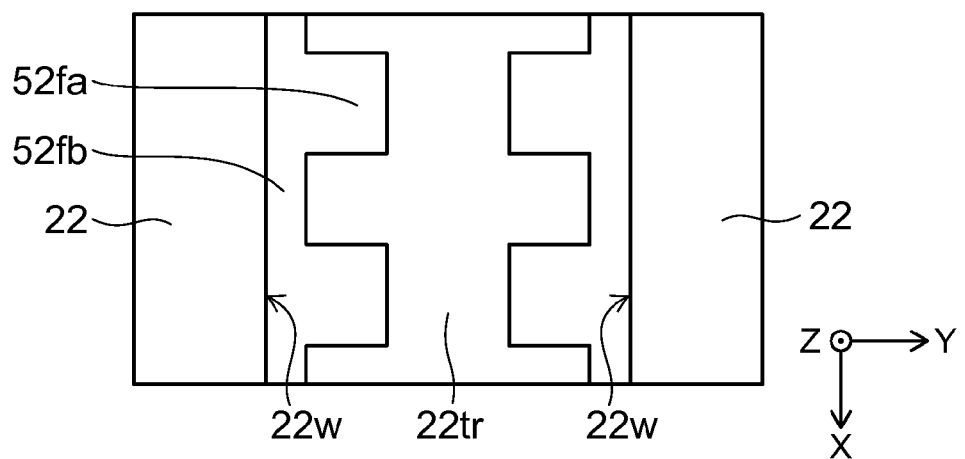
Figure 15C:
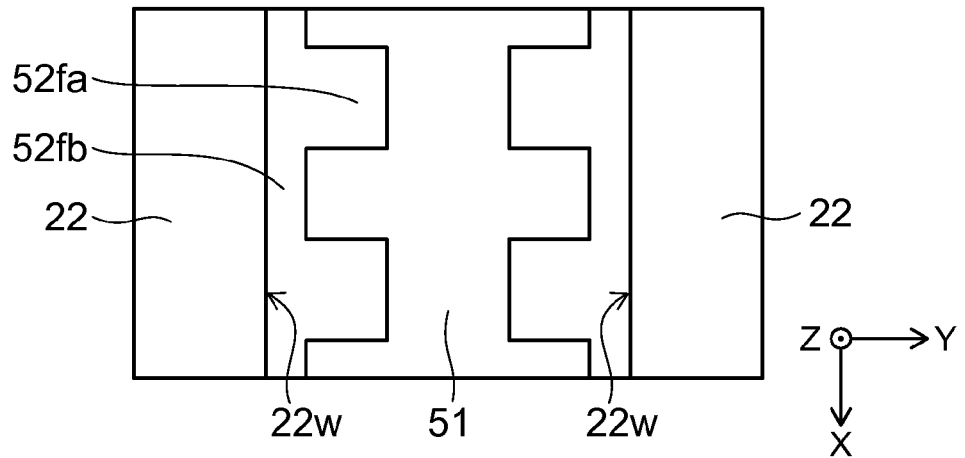

Then, as shown in FIG. 15B, insulating films are formed again on the side walls 22w of the n-type drift regions 22 using, for example, the thermal CVD. Thus, the first insulating regions 52fa large in film thickness and the second insulating region 52fb small in film thickness are formed on the side walls 22w of the n-type drift regions 22. In other words, the FP insulating films 52f each having the first insulating regions 52fa and the second insulating region 52fb are formed on the respective side walls 22w of the n-type drift regions 22. Subsequently, as shown in FIG. 15C, the FP electrode 51 is formed in the trench 22tr.

The carrier concentration in each of the semiconductor regions in the respective embodiments explained hereinabove can be assumed to be equal to the concentration of the impurities activated in each of the semiconductor regions. Therefore, the carrier concentration in each of the embodiments described above can also be replaced with the impurity concentration. The relative levels of the impurity concentration between the semiconductor regions can be confirmed using, for example, a scanning capacitance microscopy (SCM). The relative levels of the carrier concentration between the semiconductor regions can also be confirmed using the SCM. Further, the impurity concentration in each of the semiconductor regions can be measured using, for example, a secondary ion mass spectrometry (SIMS).

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a first semiconductor region of a first conductivity type;
   a second semiconductor region of a second conductivity type and selectively provided on the first semiconductor region;
   a third semiconductor region of the first conductivity type and selectively provided on the second semiconductor region;
   a first electrode electrically connected to the first semiconductor region;
   a second electrode provided on the third semiconductor region, and the second electrode electrically being connected to the third semiconductor region;
   a third electrode extending in a second direction crossing a first direction from the first electrode toward the second electrode;
   a fourth electrode provided on the first electrode side of the third electrode, and the fourth electrode extending in the second direction; and
   a first insulating film
      provided between the third electrode and the first semiconductor region, between the third electrode and the second semiconductor region, between the third electrode and the third semiconductor region, and between the fourth electrode and the first semiconductor region,
      having a first insulating region, a second insulating region and a third insulating region,
      the first insulating region and the second insulating region being provided between the fourth electrode and the first semiconductor region, and arranged in the second direction,
      the third insulating region being provided between the third electrode and the second semiconductor region, and extending in the second direction,
      a first width between the fourth electrode and the first semiconductor region in the first insulating region being different from a second width between the fourth electrode and the first semiconductor region in the second insulating region, and
      a third width of the third insulating region being constant along the second direction.

2. The device according to claim 1, wherein
   the first width in the first insulating region is larger than the second width in the second insulating region in a third direction crossing the first direction and the second direction.

3. The device according to claim 1, wherein
   the first insulating region and the second insulating region are alternately arranged in the second direction.

4. The device according to claim 1, wherein
   a length of the first insulating region is different from a length of the second insulating region in the second direction.

5. The device according to claim 1, wherein
   a length of the first insulating region is larger than a length of the second insulating region in the second direction.

6. The device according to claim 1, wherein
   a length of the first insulating region is equal to a length of the second insulating region in the second direction.

7. The device according to claim 1, wherein
   a film thickness of the second insulating region is equal to a film thickness of the first insulating film between the second semiconductor region and the third electrode.

8. The device according to claim 1, wherein
a film thickness of the second insulating region is different from a film thickness of the first insulating film between the second semiconductor region and the third electrode.

9. The device according to claim 1, wherein
a film thickness of the second insulating region is larger than a film thickness of the first insulating film between the second semiconductor region and the third electrode.

10. The device according to claim 1, wherein
the first insulating region includes a first part and a second part between the fourth electrode and the first semiconductor region, and the first part and the second part are different in thickness from each other.

11. The device according to claim 10, wherein
the first part and the second part are arranged in the first direction.

12. The device according to claim 10, wherein
the first part and the second part are alternately arranged in the first direction.

13. The device according to claim 1, wherein
the second insulating region includes a third part and a fourth part between the fourth electrode and the first semiconductor region, and the third part and the fourth part are different in thickness from each other.

14. The device according to claim 13, wherein
the third part and the fourth part are arranged in the first direction.

15. The device according to claim 13, wherein
the third part and the fourth part are alternately arranged in the first direction.

16. The device according to claim 1, wherein
a carrier concentration in the first semiconductor region in contact with the first insulating region is equal to a carrier concentration in the first semiconductor region in contact with the second insulating region.

17. The device according to claim 1, wherein
the third electrode is connected to the fourth electrode.

18. The device according to claim 1, wherein
the third electrode is unconnected with the fourth electrode.

19. The device according to claim 1, wherein
the third electrode has a constant width along the second direction, and
a width of the fourth electrode varies along the second direction.

* * * * *